United States Patent
Brilka

(10) Patent No.: US 7,103,186 B1
(45) Date of Patent: Sep. 5, 2006

(54) STEREO/TWO-TONE DEMODULATOR

(76) Inventor: Joachim Brilka, Moojerstr. 4, 22041 Hamburg (DE)

( * ) Notice: Subject to any disclaimer, the term of this patent is extended or adjusted under 35 U.S.C. 154(b) by 0 days.

(21) Appl. No.: 09/281,395

(22) Filed: Mar. 30, 1999

(30) Foreign Application Priority Data

May 16, 1998 (DE) .......................... 198 22 100

(51) Int. Cl.
*H04H 5/00* (2006.01)

(52) U.S. Cl. .......................................... 381/2; 348/485
(58) Field of Classification Search ................ 381/1, 381/2, 3; 348/485, 726, 735
See application file for complete search history.

(56) References Cited

U.S. PATENT DOCUMENTS

| 4,611,226 A | * | 9/1986 | Buhse et al. | ................. 348/485 |
| 4,808,883 A | | 2/1989 | Iwaya et al. | |
| 5,446,411 A | * | 8/1995 | Horsfall et al. | ............. 329/325 |
| 5,537,613 A | * | 7/1996 | Matsui | ........................... 381/4 |
| 5,654,606 A | | 8/1997 | Weijens et al. | |

FOREIGN PATENT DOCUMENTS

| EP | 0254147 A2 | 1/1988 |
| EP | 0643416 A1 | 3/1995 |

* cited by examiner

Primary Examiner—Ping Lee

(57) ABSTRACT

In a stereo/two-tone demodulator for demodulating an intermnediate-frequency signal having stereo or two-tone sound signals modulated on a first and a second sound carrier, the second sound carrier having a lower amplitude than the first sound carrier, ceramic filters or bandpass filters are saved and complete integration can be achieved in that a first (1) and a second (2) linear narrow-band phase-locked loop are provided each having their own frequency selectivity, the first narrow-band phase-locked loop (1) being implemented in such a way that it locks in at the frequency of the first sound carrier, and the second narrow-band phase-locked loop (2) being implemented in such a way that it locks in at the frequency of the second sound carrier. The first narrow-band phase-locked loop (1) is preceded by a first amplifier stage (4) and the second narrow-band phase-locked loop (2) is preceded by a second amplifier stage (5), each amplifier stage controlling the input signal of the subsequent phase-locked loop (1; 2) at a nominal amplitude. A carrier suppression circuit (3) is provided in which an output signal having a phase position of 0° or 180° of a voltage-controlled oscillator (20) of the first narrow-band phase-locked loop (1) and the input signal of the first narrow-band phase-locked loop (1) are superimposed and which supplies a modified interrnediate-frequency signal as an output signal in which the first sound carrier is suppressed and which is coupled to the second amplifier stage (5) preceding the second narrow-band phase-locked loop (2).

9 Claims, 1 Drawing Sheet

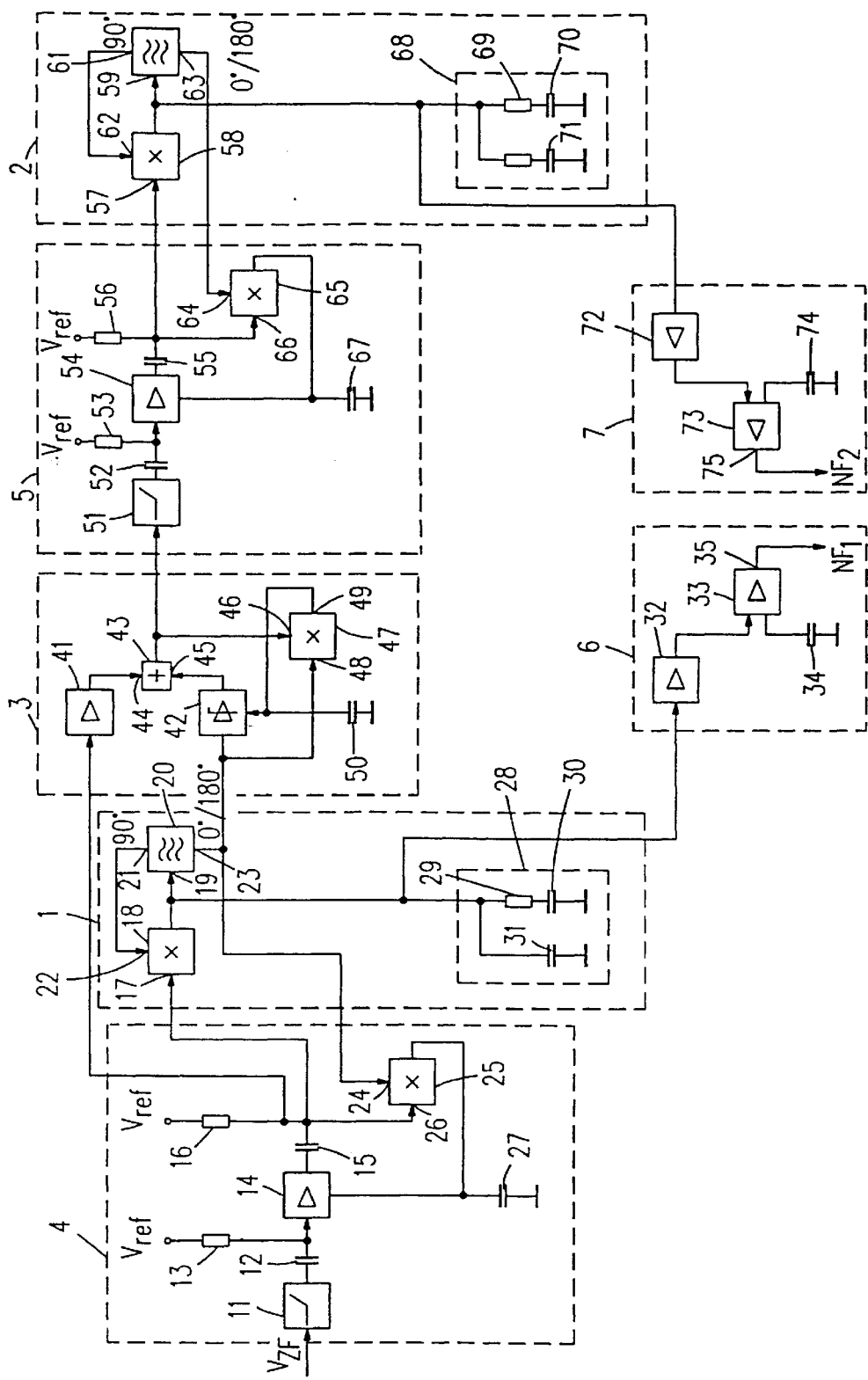

STEREO/TWO-TONE DEMODULATOR

BACKGROUND OF THE INVENTION

1. Field of the Invention

The invention relates to a stereo/two-tone demodulator for demodulating an intermediate-frequency signal comprising stereo or two-tone sound signals modulated on a first and a second sound carrier, the second sound carrier having a lower amplitude than the first sound carrier.

2. Description of the Related Art

When a stereo or a two-tone signal is transmitted, an intermediate-frequency signal, which may also comprise a picture signal, has two sound carriers on which ,sound signal components are modulated. Dependent on the transmission standard, the two sound carriers do not have equal amplitudes. One of the sound carriers may be up to 20 dB smaller as compared with the other.

In known stereo/two-tone demodulators, either ceramic bandpass filters preceding the demodulator are used, or bandpass filters are arranged within the demodulator. Since such demodulators are usually built into integrated circuits, such bandpass filters interfere because they cannot be realized within the IC but must be realized by means of additional external components which do not only require an additional external number of components, but the IC must also be provided, with equally additional connection, which is also detrimental.

SUMMARY OF THE INVENTION

It is an object of the invention to provide a stereo/two-tone demodulator which can be completely integrated and requires only a small number of components.

According to the invention, this object is achieved in that a first and a second linear narrow-band phase-locked loop are provided each having their own frequency selectivity, the first narrow-band phase-locked loop being implemented in such a way that it locks in at the frequency of the first sound carrier, and the second narrow-band phase-locked loop being implemented in such a way that it locks in at the frequency of the second sound carrier, in that the first narrow-band phase-locked loop is preceded by a first amplifier stage and the second narrow-band phase-locked loop is preceded by a second amplifier stage, each amplified stage controlling the input signal of the subsequent phase-locked loop at a nominal amplitude, and in that a carrier suppression circuit is provided in which an output signal having a phase position of 0° or 180° of a voltage-controlled oscillator of the first narrow-band phase-locked loop and the input signal of the first narrow-band phase-locked loop are superimposed and which supplies a modified intermediate-frequency signal as an output signal in which the first sound carrier is suppressed and which is coupled to the second amplifier stage preceding the second narrow-band phase-locked loop.

Thus, two linearly operating narrow-band phase-locked loops are provided which have their own selectivity. In order that these phase-locked loops can have their own selectivity, non-linear circuit elements, particularly limiters, cannot precede the phase-locked loops. Moreover, the input signal of the phase-locked loops is controlled at a nominal amplitude and, to this end, amplifier stages with such an amplitude control precede the phase-locked loops.

The first phase-locked loop is implemented in such a way that it locks in at the frequency of the first sound carrier, but the second narrow-band phase-locked loop locks in at the frequency of the second sound carrier. This can be realized by the implementation of the loop filter realizing the loop frequency response of the phase-locked loop, as well as by the corresponding implementation of the oscillator within the phase-locked loop, or by, for example, a digital lock-in circuit.

Moreover, a carrier suppression circuit is provided which superimposes the output signal of the oscillator of the first phase-locked loop, which has locked in at the first sound carrier, with the input signal of the first phase-locked loop in which both sound carriers are present. This is effected by means of an output signal of the oscillator with a 0° or 180° phase shift which is additively or subtractively superimposed on the input signal of the phase-locked loop so that the components of the first sound carrier cancel each other in this signal. It is thereby achieved that the amplitude of the first sound carrier is strongly suppressed in this signal which is applied to the second phase-locked loop. Thus, the second phase-locked loop receives a signal in which the second sound carrier, as compared with the first, is so strong that the phase-locked loop can, in any case, securely lock in on the second sound carrier, even when the first sound carrier is clearly larger than the second sound carrier in the intermediate-frequency signal. Due to the superposition in the carrier suppression circuit and the suppression achieved thereby of the first sound carrier, the second sound carrier is, in any case, stronger than the first sound carrier so that the second phase-locked loop can securely lock in on the second sound carrier.

It is thereby achieved that, independent of the amplitude ratios of the two sound carriers, the two phase-locked loops can securely lock in on that sound carrier on which they should lock in, and that they do not lock in on the other, possibly stronger sound carrier in the intermediate-frequency signal.

The circuit arrangement neither requires external ceramic filters nor bandpass filters so that it can be fully integrated. Moreover, it does not require adjustment and has a simple circuitry. A satisfactory suppression of the first sound carrier in the signal applied to the second phase-locked loop is achieved, so that also strongly deviating sound carrier amplitudes do not disturb the demodulation. Moreover, the circuit is suitable for many standards, i.e, the frequencies of the sound carriers may fluctuate within limits so that also different sound carrier frequencies can be processed. This is possible without any additional change or adjustment of the circuit arrangement.

This is particularly achieved in that, in the carrier suppression circuit, the first sound carrier in the input signal of the second phase-locked loop or of its preceding amplifier stage is always suppressed by superimposing the output signal of the oscillator of the first phase-locked loop with the signal in which the two sound carriers are still present, independent of the frequency of the first sound carrier.

In accordance with an embodiment of the invention, the carrier suppression circuit comprises a superposition stage whose first input is coupled to the input signal of the first narrow-band phase-locked loop and whose second input is coupled to an output signal of a controlled amplifier whose input receives the output signal with 0°/180° phase position of the voltage-controlled oscillator of the first narrow-band phase-locked loop and whose gain is dependent on a control signal which is supplied by an automatic gain control circuit whose input receives the output signal of the superposition stage and the input signal of the controlled amplifier, and which generates the control signal in such a way that the first sound carrier occurs with a minimal amplitude in the output signal of the superposition stage.

It is achieved with this additional implementation of the invention that the two signals in the carrier suppression circuit, superimposed in the superposition stage as regards their amplitudes are optimally controlled in such a way that an optimum suppression of the amplitude of the first sound carrier takes place at the superposition of the output signal of the oscillator of the first phase-locked loop and its input signal. This is achieved by means of the automatic gain control circuit and the controllable amplifier so that the amplitude of the first sound carrier is optimally suppressed in the output signal of the carrier suppression circuit.

In accordance with a further embodiment of the invention, the automatic gain control circuit may be advantageously implemented in such a way that the automatic gain control circuit in the carrier suppression circuit comprises a synchronous demodulator, a first input of which receives the output signal of the superposition stage and a second input receives the input signal of the controlled amplifier, i.e, the output signal with 0°/180° phase position of the voltage-controlled oscillator of the first narrow-band phase-locked loop, and whose output supplies the control signal.

Since the narrow-band phase-locked loops must have their own selectivity, no non-linear and, particularly, no amplitude-limiting elements may precede them. Instead, as explained above, a gain control is realized. In accordance with a further embodiment of the invention, this may be advantageously implemented in such a way that the gain control performed in the amplifier stages preceding the two narrow-band phase-locked loops is effected by means of a controlled amplifier whose gain is adjustable in dependence upon an output signal of a synchronous demodulator, an input of which receives the input signal of the subsequent phase-locked loop as well as the output signal with 0° phase position of the voltage-controlled oscillator.

Since the two phase-locked loops and their oscillators are locked in at the frequencies of the two sound carriers, the oscillator input signal originating from the phase comparators can be directly utilized for gaining the demodulated low-frequency sound signals. In accordance with a further embodiment of the invention, output stages supplying demodulated low-frequency sound signals are provided, the inputs of said output stages receiving the input signal from the voltage-controlled oscillator of one of the phase-locked loops.

In accordance with a further embodiment of the invention, the narrow-band phase-locked loops comprise a phase discriminator at their inputs, whose output signal is coupled to a loop filter and to a control input of a voltage-controlled oscillator which supplies signals with 0° or 180° and with 90° phase shifts at two outputs, the 90° phase position signal being coupled to a second input of the phase discriminator of the phase-locked loop.

The oscillators thus supply an output signal with a 90° phase shift which is applied in known manner to the phase discriminator of the phase-locked loop. Moreover, they supply an output signal, either with a 0° or with a 180° phase position which is used for superposition in the carrier suppression circuit and which, on the basis of this phase position, has such a phase position, either by subtraction or by addition to the signals in which the two sound carriers are still present, that an ideal suppression of the first sound carrier is possible. The output signal with the 0° phase position is also required for the automatic gain control.

The implementation of the two phase-locked loops in such a way that they lock in at the frequency of the appropriate sound carrier may be advantageously achieved in that, in accordance with a further embodiment of the invention, the narrow-band phase-locked loops have a digital lock-in means which maintains the frequency of the voltage-controlled oscillator in a predetermined frequency range.

The connections for the output signals of the oscillators of the phase-locked loops and the connections for these output signals of the first oscillator to the superposition stage within the carrier suppression circuit may be advantageously realized in accordance with a further embodiment of the invention in that the output signal with 0°/180° phase position of the voltage-controlled oscillator of the first phase-locked loop is coupled to the second input of the superposition stage of the carrier suppression circuit, and in that the output signals with 90° phase position of the voltage-controlled oscillators of the two phase-locked loops are coupled to an input of the phase discriminator of the respective preceding amplifier stage.

These and other aspects of the invention will be apparent from and elucidated with reference to the embodiments described hereinafter.

BRIEF DESCRIPTION OF THE DRAWING

In the drawing:

The sole FIGURE is a block diagram of a stereo/two-tone demodulator in accordance with the invention, including a superposition stage.

DESCRIPTION OF THE PREFERRED EMBODIMENT

The input of the circuit arrangement receives an intermediate-frequency (IF) signal $V_{ZF}$ comprising a first and a second sound carrier on which a stereo or a two-tone signal is modulated. These two sound carriers may have strongly deviating amplitudes, with differences that may be 20 dB and more. Dependent on the transmission standard, the amplitude of the first sound carrier having the lower frequency is generally larger than the frequency of the second sound carrier. Picture signal components may also be present in the IF signal. These components may, however, also be filtered out previously by circuit elements which are not shown in the FIGURE.

In any case, the IF signal $V_{ZF}$ comprises the two sound carriers in an intermediate-frequency position.

The circuit arrangement comprises a first narrow-band phase-locked loop 1 (NBPLL) which is implemented in such a way that it locks in at the frequency of the first sound carrier having the lower frequency, and a second NBPLL 2 which locks in at the frequency of the second sound carrier. Amplifier stages 4 and 5 precede the two PLLs 1 and 2 and are used for amplitude control and additional filtering. Furthermore, a carrier suppression circuit 3 is provided by means of which the first carrier is suppressed in the input signal of the second PLL 2. Output stages 6 and 7 are provided to output the demodulated low-frequency sound signals.

The IF signal $V_{ZF}$ applied to the first amplifier stage 4 preceding the first PLL 1 first reaches, within the amplifier stage 4, a Sallen and Key filter 11 representing a second-order high-pass filter. Its output signal is applied to an RC filter which is composed of a series capacitance 12 and a resistor 13 connected to a reference potential $V_{ref}$. The Sallen and Key filter 11 and the RC filter 12 and 13 jointly constitute a third-order high-pass filter by means of which picture signal components which may be present in the signal $V_{ZF}$ can be suppressed. It is also achieved by way of this filter arrangement that the disturbing spectral components of the IF signal occurring at ½ and ⅓ of the frequency of the sound carriers are attenuated. Within the amplifier stage 4, the IF signal thus pre-filtered is applied to a controlled amplifier 14 which, in turn, precedes an RC filter composed of a series capacitance 15 and a resistor 16 connected to a reference potential $V_{ref}$. Behind this filtering, the first amplifier stage supplies an output signal which is applied to an amplifier 41 in the superposition stage and to a first input 17 of a phase discriminator 18 arranged in the first PLL 1. The output of the phase discriminator 18 supplies a control signal to a first input 19 of an oscillator 20. A first output 21 of the oscillator 20 supplies an output signal having a phase position of 90°, this output signal being applied to a second input of the phase discriminator 22. In connection with a further loop filter, to which the output signal of the phase discriminator is applied, these circuit elements constitute a PLL. The loop filter 28 comprises a series arrangement of a resistor 29 and a capacitance 30 connected to a reference potential. This series arrangement is connected in parallel to a capacitance 31 connected to the reference potential.

A synchronous demodulator 25, whose first input receives the output signal from a second output 23 of the oscillator 20 of the PLL 1, is arranged within the amplifier stage 4. In contrast to the output signal of the output 21 of the oscillator 20, the output signal of this second output 23 has a phase position of 0° or 180°.

Furthermore, a second input 26 of the synchronous demodulator 25 receives the input signal of the PLL 1. The output signal of the synchronous demodulator 25 is fed back to a control input of the controllable amplifier 14. This signal is coupled to ground by means of a capacitance 27 so that a low-pass filtering is obtained. By means of this circuit arrangement, it is achieved that the amplitude of the first sound carrier, at which the oscillator 20 has locked in, is controlled. A nominal amplitude of this first sound carrier is thereby adjusted at the input of the PLL 1. This is an essential condition for the fact that the PLL 1 has its own selectivity. It is implemented in such a way that it locks in at the frequency of the first sound carrier. If necessary, this may be further supported in a way not shown in the FIGURE, in that a digital lock-in circuit is provided which ensures that the controllable oscillator 20 can operate only in a predetermined frequency range around the frequency of the first sound carrier. It is thereby additionally ensured that the first PLL 1 locks in at the frequency of the first sound carrier. The operation of the loop filter 28 transformed to a bandpass filter by the PLL is thus supported.

Within the carrier suppression circuit, the input signal of the first PLL 1, still comprising the two sound carriers, reaches the amplifier 41.

The output signal with a 0° or 180° phase position made available at the second output 23 of the controllable oscillator 20 of the first PLL 1 is applied to a controllable amplifier 42 within the carrier suppression circuit 3. This signal has the frequency of the first sound carrier in so far as the first PLL has locked in at this first sound carrier, which is hereinafter assumed to be the case.

The carrier suppression circuit 3 comprises a superposition stage 43, a first input 44 of which receives the output signal of the amplifier 41 and a second input 45 receives the output signal of the controllable amplifier 42.

Since the output 23 of the oscillator 20 supplies a signal whose frequency is identical to the first sound carrier and, relative thereto, has a defined phase shift of 0° or 180°, a superposition may be performed in the superposition stage 43 by means of which the first sound carrier is eliminated or at least strongly suppressed. For example, if the output signal at the second output 23 of the controllable oscillator 20 has a phase shift of 0°, a subtraction of the two signals is performed in the superposition stage 43. If, on the other hand, the output signal of the controllable oscillator 20 has a phase shift of 180°, an additive superposition is performed in the superposition stage. In both cases, it is achieved by this superposition that the first sound carrier in the output signal of the superposition stage 43 is suppressed. Otherwise, the signal remains unchanged. The first sound carrier is thereby suppressed in the second PLL 2 and the amplifier stage 5 preceding this PLL. This is the unchanged, pre-filtered IF signal which is also applied to the PLL 1.

The superposition in the superposition stage 43 as explained above, suppressing the first sound carrier, is so successful because the phase position and the frequency of the input signals of the superposition stage 43 are exactly defined, whereby an exact suppression of the first sound carrier is realized. To further improve this suppression, an amplitude control is performed. A synchronous demodulator 47 is provided for this purpose, which has a first input 46 receiving the output signal of the superposition stage 43 and a second input 48 receiving the output signal of the second output 23 of the controllable oscillator 20 with the 0° or 180° phase position. An output 49 of the synchronous demodulator 47 applies a control signal to the controllable amplifier 42 which is additionally low-pass filtered by means of a capacitance 50 coupled to a reference potential.

The synchronous demodulator 47 controls the amplitude in such a way that the signal components in the output signal of the superposition stage 43 at the frequency which the controllable oscillator 20 supplies at its output 23 are controlled to a minimum. This is effected in that the controllable amplifier 42 is adjusted as regards its gain by means of the output signal of the synchronous demodulator 47 in such a way that the signal components having the frequency of the first sound carrier are optimally suppressed in the output signal of the superposition stage 43.

This output signal of the carrier suppression circuit 3 and the superposition stage 43 within this circuit is applied to a Sallen and Key filter 51 within the second amplifier stage 5 which precedes the second PLL 2.

The second amplifier stage 5 is further identical to the first amplifier stage 4. It also comprises the Sallen and Key filter 51, a subsequent RC filter 52, 53, a controllable amplifier 54 and a synchronous demodulator 65.

The second PLL 2 preceded by the second amplifier stage 5 is also identical to the first PLL 1 and comprises a phase discriminator 58, a controllable oscillator 60 and a loop filter 68 with a resistor 69 and two capacitances 70 and 71.

The gain control performed by means of the synchronous demodulator 65 within the second PLL 2 and the preceding amplifier stage 5 is effected in the same manner as in the first PLL 1 and the preceding first amplifier stage 4.

Since the first sound carrier in the input signal of the second amplifier stage 5, and hence also in the input signal of the second PLL 2, is suppressed by the carrier suppression circuit 3, the second PLL 2 can lock in optimally at the frequency of the second sound carrier, even if it originally had a clearly lower amplitude in the IF signal $V_{ZF}$ than the first sound carrier.

The output stages 6 and 7 provided to gain the low-frequency sound carrier signals can directly operate with the input signal of the controllable oscillators 20 and 60 because they are locked in at the first and the second sound carrier in the locked-in state, and the input control signals provide the sound carrier frequency deviation which exactly corresponds to the transmitted stereo or two-tone signals.

The output stage 6 thus receives this input signal at the input 19 of the controllable oscillator 20, which signal originates from the phase discriminator 18 and is coupled to the loop filter 28. Within the first output stage 6, this signal initially reaches an amplifier 32 whose output signal is coupled to a further amplifier 33. Furthermore, a capacitance 34 is provided which is used for decoupling the low-frequency signal from its DC component. An output 35 of the amplifier 33 supplies the low-frequency and demodulated sound signal NF, modulated on the first sound carrier.

The second output stage 7 comprises a first amplifier 72 and a second amplifier 73, similarly as the first output stage, but the second output stage 7 receives the output signal of the phase discriminator 58 of the second PLL 2 which is coupled to the input 59 of the controllable oscillator 60 and which is also coupled to the loop filter 78 in the second PLL. The output 75 of the amplifier 73 thus supplies the sound signal modulated on the second sound carrier in a demodulated form, which is denoted by $NF_2$ in the FIGURE.

In summary, this circuit arrangement realizes a modulation of a stereo or two-tone signal by means of a relatively simple circuit arrangement, without the need of external ceramic filters or additional bandpass filters within this circuit arrangement. It is the carrier suppression circuit 3 with which the first sound carrier, being essentially stronger as regards its amplitude, is suppressed in the signal applied to the second PLL 2.

What is claimed is:

1. A stereo/two-tone demodulator for demodulating an intermediate-frequency signal comprising stereo or two-tone sound signals modulated on a first and a second sound carrier, the second sound carrier having a lower amplitude than the first sound carrier, characterized in that the demodulator comprises:

a first and a second linear narrow-band phase-locked loop each having a respective frequency selectivity, the first narrow-band phase-locked loop being implemented for locking in at a frequency of the first sound carrier, and the second narrow-band phase-locked loop being implemented for locking in at a frequency of the second sound carriers;

a first amplifier stage coupled to an input of the first narrow-band phase-locked loop, and a second amplifier stare coupled to an input of the second narrow-band phase-locked loop, each of said first and second amplifier stages controlling the input signal of the subsequent respective narrow-band phase-locked loop at a nominal amplitude; and a carrier suppression circuit coupled to receive an output signal having a phase position of 0° or 180° of a voltage-controlled oscillator of the first narrow-band phase-locked loop, and the input signal of the first narrow-band phase-locked loop, said carrier suppression circuit superimposing said output signal and said input signal for supplying a modified intermediate-frequency signal as an output signal in which the first sound carrier is suppressed, the output signal from said carrier suppression circuit being coupled to the second amplifier stage preceding the second narrow-band phase-locked loop.

2. An arrangement as claimed in claim 1, characterized in that the carrier suppression circuit comprises:

a superposition stage having a first input coupled to the input signal of the first narrow-band phase-locked loop a second input;

a controlled amplifier having an input for receiving the output signal with 0° /180° phase position of the voltage-controlled oscillator of the first narrow-band phase-locked loop, and an output coupled to the second input of the superposition stage, a gain of said controlled amplifier being dependent on a control signal; and an automatic gain control circuit having a first input for receiving an output signal of the superposition stage, a second input for receiving the input signal of the controlled amplifier, and an output for supplying the control signal for the controlled amplifier, such that the first sound carrier occurs with a minimal amplitude in the output signal of the superposition stage.

3. An arrangement as claimed in claim 2, characterized in that the automatic gain control circuit comprises a synchronous demodulator.

4. An arrangement as claimed in claim 2, characterized in that the output signal with 0°/180° phase position of the voltage-controlled oscillator of the first phase-locked loop is coupled to the second input of the superposition stage of the carrier suppression circuit, and in that the output signals with 90° phase position of the voltage-controlled oscillators of the first and second narrow-band phase-locked loops are coupled to an input of phase discriminator of the respective phase-locked loops.

5. An arrangement as claimed in claim 1, characterized in that the first and second amplifier stages preceding the two narrow-band phase-locked loops each comprises:

a controlled amplifier for performing gain control, a gain of said controllable amplifier being adjustable in dependence upon a control signal; and a synchronous demodulator having a first input for receiving the input signal of the subsequent phase-locked loop, and a second input for receiving the output signal with 0° phase position of the voltage-controlled oscillator, an output of the synchronous demodulator supplying the control signal for the controllable amplifier.

6. An arrangement as claimed in claim 5, characterized in that each of the first and second amplifier stages further comprises a third-order filter with a second-order Sallen and Key filter for high-pass filtering the intermediate-frequency signal.

7. An arrangement as claimed in claim 1, characterized in that the arrangement further comprises output stages for supplying demodulated low-frequency sound signals are provided, the inputs of said output stages receiving the input signal to the voltage-controlled oscillators of the first and second narrow-band phase-locked loops, respectively.

8. An arrangement as claimed in claim 1, characterized in that each of the first and second narrow-band phase-locked loops comprises:

a phase discriminator having an input coupled to the input of the respective narrow-band phase-locked loop;

a loop filter coupled to an output of the phase discriminator; and a voltage-controlled oscillator having a control input also coupled to the output of the phase discriminator, and a first output for supplying a signal with a 0° or 180° phase shift, and a second output for supplying a signal with a 90° phase shift, the second output being coupled to a second input of the phase discriminator.

9. An arrangement as claimed in claim 8, characterized in that the first and second narrow-band phase-locked loops have digital lock-in means for maintaining the frequency of the voltage-controlled oscillator in a predetermined frequency range.

* * * * *